United States Patent
Talledo

(10) Patent No.: US 10,147,673 B2
(45) Date of Patent: Dec. 4, 2018

(54) TAPELESS LEADFRAME PACKAGE WITH UNDERSIDE RESIN AND SOLDER CONTACT

(71) Applicant: STMicroelectronics, Inc., Calamba (PH)

(72) Inventor: Jefferson Talledo, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 15/281,800

(22) Filed: Sep. 30, 2016

(65) Prior Publication Data

US 2018/0096923 A1    Apr. 5, 2018

(51) Int. Cl.
| | |
|---|---|
| H01L 23/49 | (2006.01) |
| H01L 23/498 | (2006.01) |
| H01L 23/495 | (2006.01) |
| H01L 21/48 | (2006.01) |

(52) U.S. Cl.
CPC ...... *H01L 23/49805* (2013.01); *H01L 21/481* (2013.01); *H01L 21/4825* (2013.01); *H01L 21/4828* (2013.01); *H01L 23/4952* (2013.01); *H01L 23/49558* (2013.01); *H01L 2224/48091* (2013.01); *H01L 2224/48247* (2013.01); *H01L 2224/49175* (2013.01); *H01L 2224/73265* (2013.01); *H01L 2924/181* (2013.01)

(58) Field of Classification Search
CPC ........... H01L 23/49524; H01L 23/60; H01L 23/49562; H01L 23/3107; H01L 2924/0002; H01L 2924/00; H01L 23/50; H01L 23/49811; H01L 33/62
See application file for complete search history.

(56) References Cited

U.S. PATENT DOCUMENTS

| | | | |
|---|---|---|---|
| 9,773,960 B2 * | 9/2017 | Oda | H01L 24/97 |
| 2008/0006940 A1 * | 1/2008 | Zhou | H01L 23/3128 257/737 |
| 2012/0061822 A1 * | 3/2012 | Pagaila | H01L 21/4832 257/737 |

* cited by examiner

Primary Examiner — (Vikki) Hoa B Trinh
(74) Attorney, Agent, or Firm — Seed IP Law Group LLP

(57) ABSTRACT

The present disclosure is directed to a semiconductor die on a tapeless leadframe and covered in encapsulant. The semiconductor package includes leads formed from the leadframe and electrically coupled to the semiconductor die, the leads being accessible through electrical contacts embedded in the encapsulant. Openings between the leads and the leadframe are formed from etching recesses from opposing sides of the leadframe. The resulting openings have non-uniform sidewalls. The leadframe is further electrically or thermally coupled to electrical contacts embedded in the encapsulant. The embedded electrical contacts forming a land grid array.

19 Claims, 6 Drawing Sheets

TAPELESS LEADFRAME PACKAGE WITH UNDERSIDE RESIN AND SOLDER CONTACT

BACKGROUND

Technical Field

The present disclosure is directed to an encapsulated semiconductor die and leadframe package that resists flexing.

Description of the Related Art

Semiconductor packages often include a semiconductor die and a leadframe that provides an interface between contacts and the semiconductor die. The semiconductor package can include an encapsulant to secure the elements of the package into a single discrete unit. The semiconductor die is typically placed on the leadframe, and the combination is covered with encapsulant in an application chamber. The encapsulant is typically applied at high pressure or temperature, and is then allowed to cool and solidify around the package elements.

Unfortunately, as die and leadframe sizes continue to shrink, the packages become more susceptible to warping, crumpling, and fracturing. The fragility of the packages greatly increases the difficulty of handling the packages during the manufacturing process and greatly decreases overall percentage of viable packages from each manufacturing batch.

BRIEF SUMMARY

The present disclosure is directed to a semiconductor package including a thin leadframe with recesses etched into opposing sides of the leadframe. A first subset of recesses on a first side of the leadframe house electrical contacts, and a second subset of recesses on the first side combine with a third subset of recesses on a second side of the leadframe to form openings in the leadframe. The openings separate the leadframe from leads formed out of the leadframe. The distance between the sidewalls of the openings varies from the first side of the leadframe to the second side as an artifact from the opening formation by etching recesses. A semiconductor die is attached to the second side of the leadframe and connectors are used to electrically connect the die to the leads formed from the leadframe. The package elements are encapsulated, with the encapsulant then partially removed to expose the electrical contacts through the encapsulant.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Throughout the specification, the term "layer" is used in its broadest sense to include a thin film, a cap, or the like, and one layer may be composed of multiple sub-layers.

Specific embodiments of leadframe packages are described herein; however, the present disclosure and the reference to certain materials, dimensions, and the details and ordering of processing steps are exemplary and should not be limited to those shown.

Figure 7:
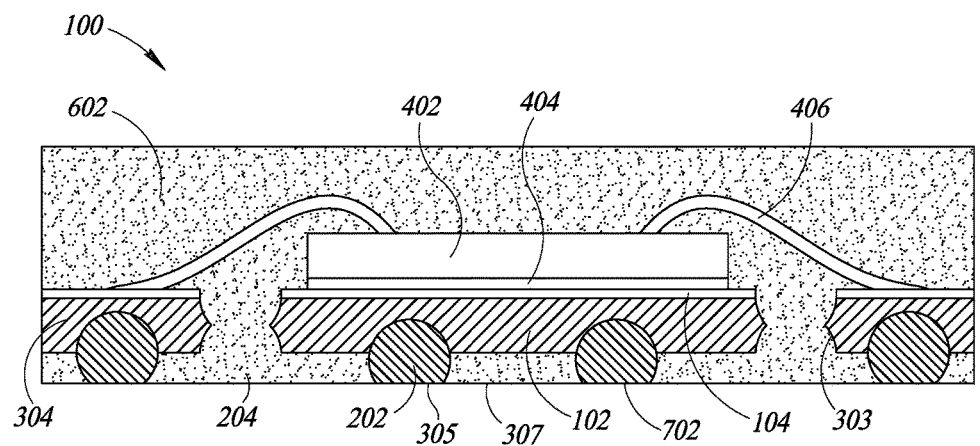
FIG. 7 is a cross-sectional view of the encapsulated leadframe package of FIG. 6 after removal of some of the encapsulant on the first side of the leadframe to expose the electrical contacts.
Figure 8:
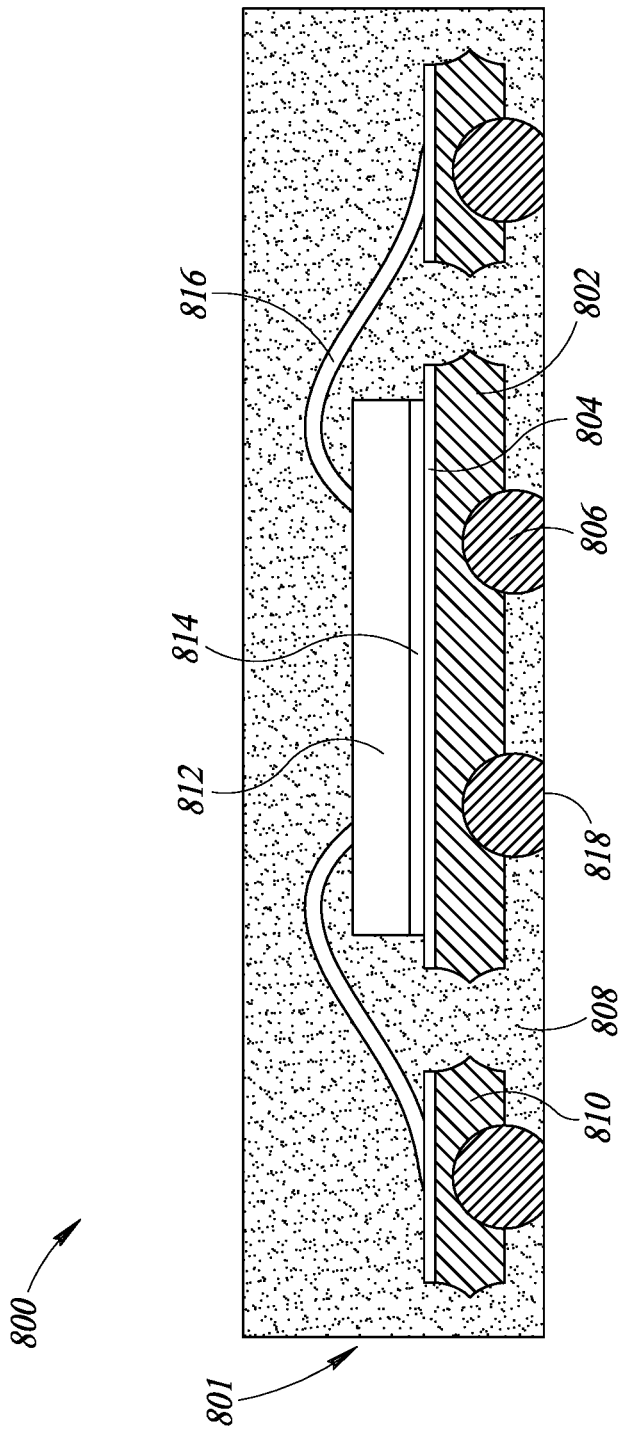
FIG. 8 is a cross-sectional view of an alternate embodiment of a leadframe package in which leads do not extend to an edge of an encapsulant.
Figure 9:
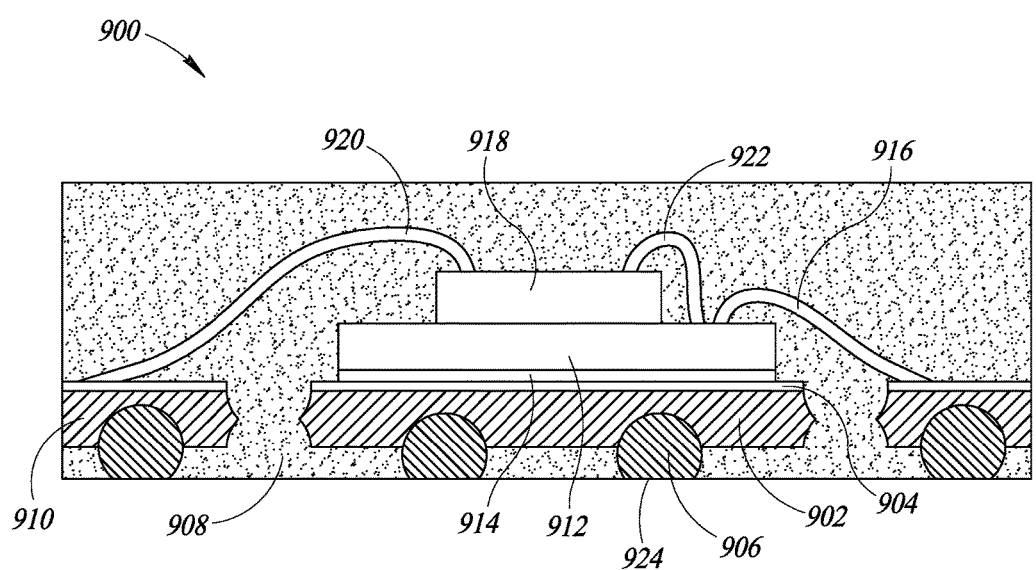
FIG. 9 is a cross-sectional view of an alternate embodiment of a leadframe package in which two semiconductor die are attached to a leadframe in a stack.

The present disclosure is generally directed to leadframe die packages, such as packages in FIGS. 7-9 that include encapsulant on both sides of the leadframe. The packages include one or more die that are attached to an etched leadframe that is etched on two opposing sides to form recesses and openings. The recesses are filled with electrical contacts and the openings separate the leadframe from leads in the leadframe die package. The electrical contacts are formed in the recesses and have a surface that is coplanar with a surface of the encapsulant. The recesses can exhibit a shape that resembles a portion of a sphere, with the electrical contacts exhibiting a shape that resembles a different portion of a sphere with a similar radius. The package includes encapsulant, with openings in the encapsulant for the electrical contacts or other elements of the package. The package includes encapsulant on two sides of the leadframe to help prevent warpage, crumpling, and fracturing.

FIGS. 1-7 are views of a package 100 in various stages of a process of forming the package. FIG. 7 represents one embodiment of a finished leadframe die package 100. The leadframe package 100 includes a leadframe 102 supporting a semiconductor die 402. The semiconductor die 402 is electrically coupled to leads 304 formed from the leadframe 102. The leads 304 are separated from a central portion of the leadframe using an etching process performed from both sides of the leadframe 102. This etching process forms openings between the leads 304 and the leadframe 102 forms a non-uniform sidewall surface 303. The semiconductor die 402 and the leadframe 102 are surrounded by encapsulant to protect the leadframe package 100 and give the leadframe package 100 additional structural support, with the particular application of encapsulant protecting the leadframe from warpage, crumpling, and fracturing.

The package 100 includes a plurality of electrical contacts 202, which have a surface 305 that is coplanar with a surface 307 of a first portion 204 of the encapsulant 602. The electrical contacts may be solder balls that once reflowed fill in recesses 110, see FIG. 1.

Figure 1:
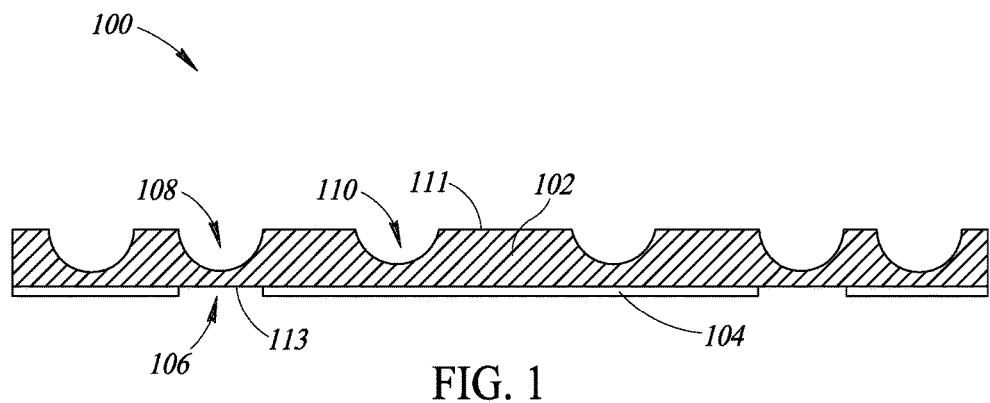
FIG. 1 is a cross-sectional view of a leadframe with recesses etched in a first side.
Figure 2:
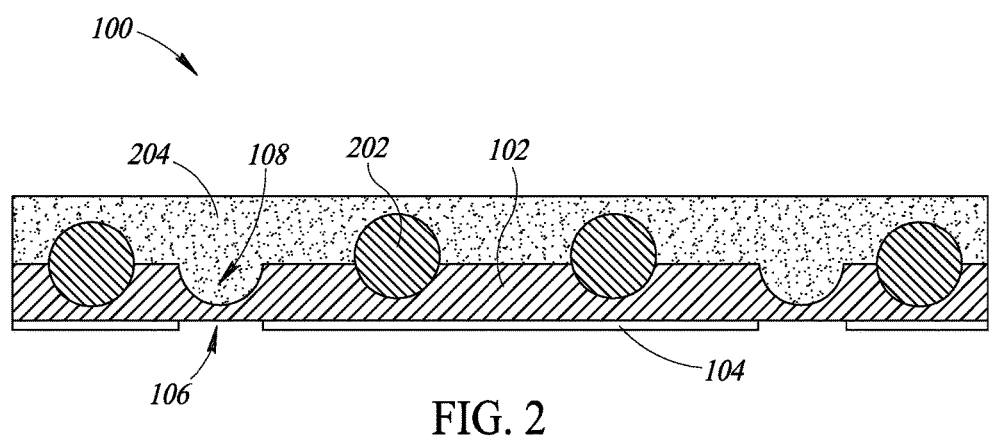
FIG. 2 is a cross-sectional view of electrical contacts in the recesses of the leadframe of FIG. 1 where the electrical contacts are covered by an encapsulant.
Figure 3:
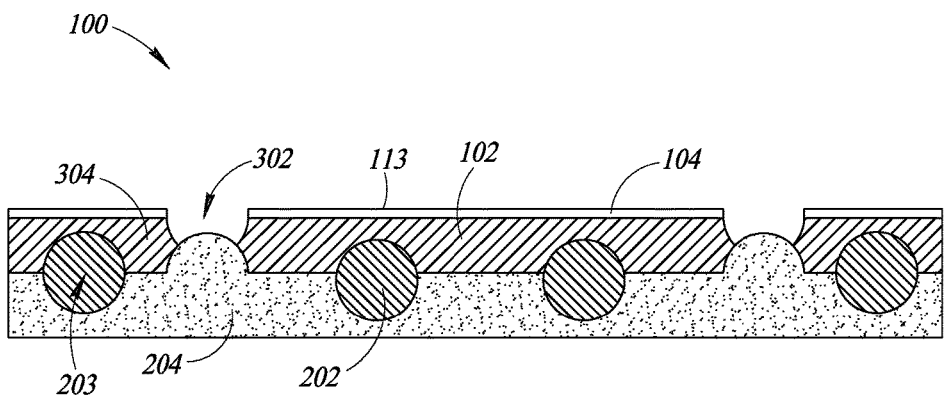
FIG. 3 is a cross-sectional view of the leadframe of FIG. 2 flipped over with recesses etched in a second side of the leadframe.
Figure 4:
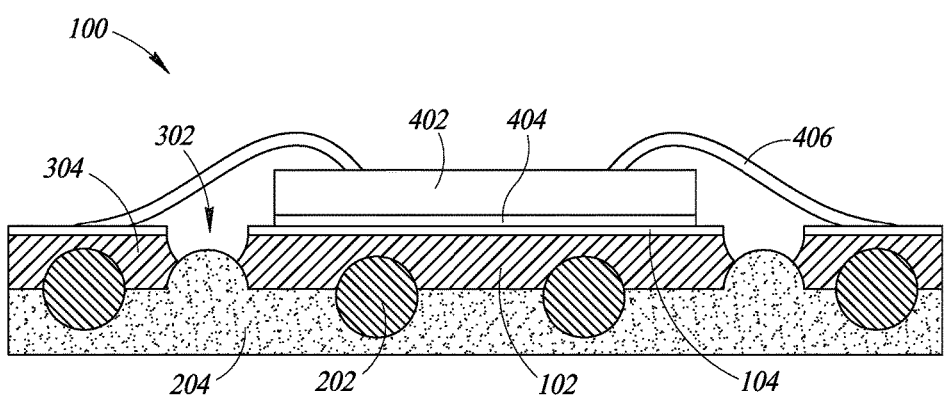
FIG. 4 is a cross-sectional view of a die attached to the leadframe of FIG. 3.
Figure 5:
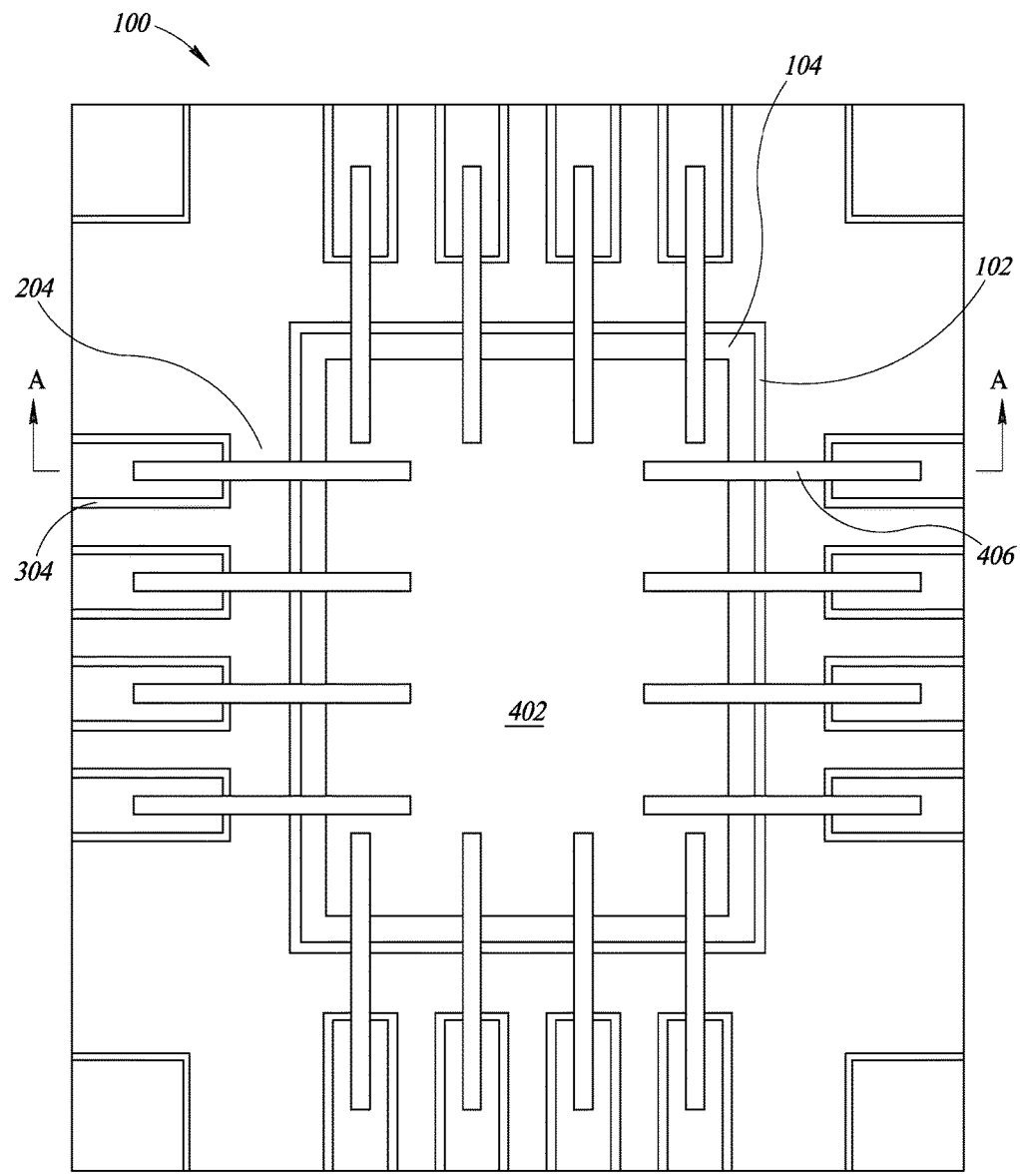
FIG. 5 is a top plan view of the leadframe and die of FIG. 4, with FIG. 4 taken at cross-section line AA of FIG. 5.
Figure 6:
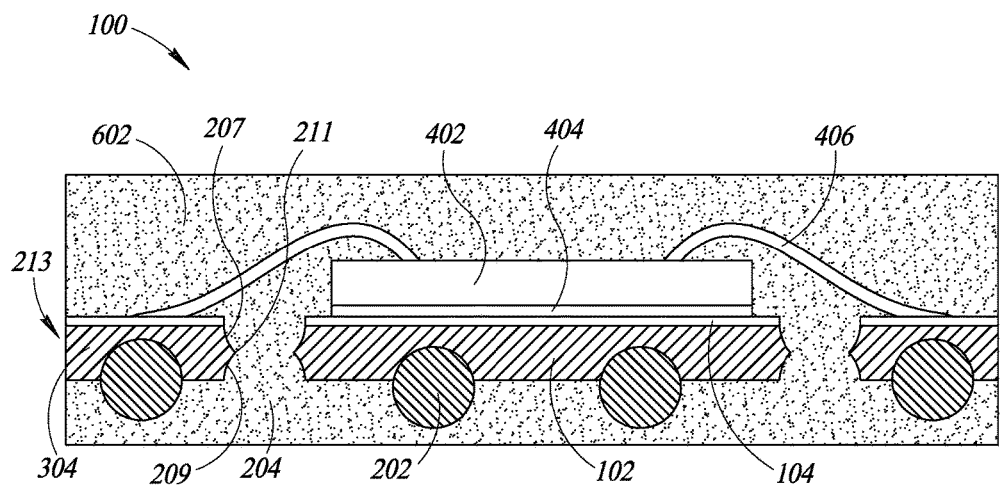
FIG. 6 is a cross-sectional view of the die and leadframe of FIG. 4 with an encapsulant on the second side of the leadframe.

FIGS. 1-4, 6 and 7 are views of various steps of a process to fabricate the leadframe package 100 depicted in FIG. 7. FIG. 5 is a top down view of the die and leadframe package to show relationships of the various components of the package. FIG. 1 is a cross-sectional view of the leadframe package 100 after being etched on a first side 111 to form recesses 108 and 110. FIG. 2 is a cross-sectional view of the leadframe 102 including electrical contacts 202 formed in a first group 110 of the recesses. The first portion of encapsulant 204 is formed on the electrical contacts 202 and in the second group 108 of recesses. Then in FIG. 3 the leadframe 102 is etched on a second side 113. FIG. 4 is a cross-sectional view of the leadframe that corresponds to the cross-sectional line A-A in FIG. 5. FIG. 4 includes a semiconductor die 402 coupled to the leadframe 102 and the leads 304. FIG. 6 is a cross-sectional view of a second portion 602 of encapsulant covering the die and the second side of the leadframe 102. Then, in FIG. 7, the first encapsulant 204 is partially removed to expose the surface 305 of the electrical contacts 202. These steps and the various embodiments of the device are described in greater detail below.

As represented in the cross-sectional view of FIG. 1, assembly of the leadframe package 100 begins with the leadframe 102. The leadframe 102 provides structure and support for the die. The leadframe may carry one or more signals from the semiconductor die to an exterior portion, such as a lead 304 of the leadframe package 100. In some embodiments, the leadframe 102 structurally supports the semiconductor die during the packaging process. The leadframe 102 may be made of any suitable material for providing structure or signal communication, such as various metals like copper or a metal-alloy. In some embodiments, the leadframe 102 may be a tapeless leadframe that has no tape used on the bottom surface of the leadframe to secure the whole leadframe parts together in place during manufacturing.

In some embodiments, the leadframe 102 has a thickness less than or equal to 100 µm. At a thickness less than or equal to 100 µm, the leadframe becomes fragile and prone to warpage, crumpling, or fracturing during manufacturing and use. One of the issues observed is frowning warpage in which a different rate of cooling of various elements with different coefficients of thermal expansion (CTEs) within the leadframe package 100 cause the leadframe package 100 to become warped. The warpage is such that the center of the leadframe package 100 extends away from a plane passing through two opposing ends of the leadframe 102 due to the leadframe 102 contracting faster and to a greater overall amount than an encapsulant because of a higher CTE. Also, the leadframe 102 at these small thicknesses can be very fragile and can benefit from additional supporting structure during the assembly and manufacturing process. The leadframe package 100 is manufactured according to the below description to minimize the effects of different cooling rates and leadframe fragility.

The leadframe 102 has the first side 111 and the second side 113 opposite the first side. A protection layer 104 is deposited or otherwise formed on the second side of the leadframe 102. The protection layer 104 is a thin layer of plating material that acts as oxidation protection and may act as a mask for the leadframe 102. The protection layer 104 is made of a suitable protective material, such as gold or silver. In other embodiments, the protection layer 104 includes more than one layer, such as a stack of three layers made of nickel, palladium, and gold, respectively. The protection layer 104 includes openings 106 that expose the second side of the leadframe 102.

The first side of the leadframe 102 is etched to create the first group of recesses 108. These first recesses 108 are aligned with the openings 106 on the second side of the leadframe 102 such that the first recesses 108 are directly opposite to the openings 106. The first recesses 108 in the first side of the leadframe 102 create indentations that may extend more than half way into the leadframe 102. The first recesses 108 have a decreased cross-sectional area between the first side and a bottom of the recesses measured in planes parallel to the first side of the leadframe 102. In some embodiments, the cross-sectional area decreases along a depth of the recesses. In some embodiments, each one of the first recesses 108 has a sidewall with an elliptical curvature when viewed from the side shown in FIG. 1. In other embodiments, each one of the first recesses 108 has a cross-sectional shape of a portion of a circle. And in yet another embodiment, each one of the first recesses 108 has a cross-sectional shape of half of a circle, as is shown in FIG. 1. In other words, walls of the recesses 108 and 110 are curved.

The first side of the leadframe 102 is also etched to create the second group of recesses 110. The second recesses 110 are not aligned with the openings 106 on the second side of the leadframe 102. Instead, the second recesses 110 are directly opposite to the protection layer 104. The second recesses 110 in the first side of the leadframe 102 create indentations that may extend more than half way into the leadframe 102. These recesses are curved however other contours are possible.

In some embodiments, the first recesses 108 have a similar cross-sectional shape or dimensions to that of the second recesses 110. The first recesses 108 and the second recesses 110 may be formed at the same time or by the same process. In some embodiments, the protection layer 104 is added to the second side of the leadframe 102 before etching of the first side of the leadframe 102 to form the first and second recesses 108 and 110 on the first side of the leadframe 102.

FIG. 2 is a cross-sectional view of the electrical contacts 202 formed in the second group 110 of the recesses of the leadframe 102 of FIG. 1. The first group 108 of the recesses is not filled by the electrical contacts 202. The first group 108 is filled by the encapsulant 204 formed on the first side 111 of the leadframe 102. The electrical contacts 202 are made of a conductive material, such as from metals and metal alloys, like solder. Each of the electrical contacts 202 may be identically shaped or sized in some embodiments. In other embodiments, the electrical contacts 202 may include electrical contacts of different shapes or sizes. In one embodiment, each one of the electrical contacts 202 is spherical, and at this point in the manufacturing process the spherical electrical contacts resemble a ball grid array. The electrical contacts 202 have a thickness that exceeds the depth of the second recesses 110 such that after the electrical contacts 202 are deposited in the second recesses 110, the electrical contacts 202 protrude from the surface of the first side of the leadframe 102. In one embodiment, more than half the volume of each of the electrical contacts 202 protrude from the first side of the leadframe 102. Said differently, a portion of each electrical contact is within the leadframe and a portion of each electrical contact is above the first side 111 of the leadframe.

After depositing the electrical contacts 202 in the second recesses 110, the first side of the leadframe 102 is covered in the first portion of the encapsulant 204, the first encapsulant. The first encapsulant 204 fills the first recesses 108. In one embodiment, the first encapsulant 204 covers the entirety of the electrical contacts 202. In another embodiment, the first encapsulant 204 only partially surrounds the electrical contacts 202, with a portion of each of the electrical contacts 202 protruding from a surface of the first encapsulant 204. In some embodiments, the first encapsulant 204 is a resin molding.

The first encapsulant 204 provides additional structural support to the leadframe 102 during the remaining manufacturing steps and during use. The first encapsulant 204 may require preheating the encapsulant prior to application and then cooling as part of a curing process. In some embodiments, the first encapsulant 204 is cured before proceeding to any remaining manufacturing steps. In other embodiments, the first encapsulant 204 is not cured before proceeding with later manufacturing steps. The curing of the first encapsulant 204 at this step would normally cause warpage; however because the leadframe 102 is still exposed, the leadframe 102 can be secured during curing to prevent warpage.

FIG. 3 is a cross-sectional view of the leadframe 102 of FIG. 2 flipped over with a third group of recesses etched in the second side 113 of the leadframe 102. The third recesses 302 are etched into the second side of the leadframe 102. The third recesses 302 are aligned with the openings 106 in the protection layer 104 on the second side of the leadframe 102 such that the third recesses 302 are directly opposite to the first recesses 108, now filled with encapsulant 204. The protection layer may act as a mask for this etching. The third recesses 302 in the second side of the leadframe 102 create indentations in the leadframe 102 that extend to the encapsulant 204. When etched, each of the third recesses 302 has encapsulant protruding into the recess towards the second side of the leadframe 102. The third recesses 302 may have curvature similar to the recesses described above. In some embodiments, the third recesses 302 have a similar cross-sectional shape or dimensions to that of the first recesses 108, except for a portion removed due to the protrusion of the encapsulant 204.

The third recesses 302 combine with the first recesses 108 to isolate side portions of the leadframe 102 from the center of the leadframe 102. The side portions of the leadframe 102 once separated from the leadframe 102 become the leads 304. The leads 304 are coupled to a first subset 203 of the electrical contacts 202, with at least one of the electrical contacts 202 associated with a respective one of the leads 304.

FIG. 4 is a cross-sectional view of a die 402 attached to the leadframe 102 of FIG. 3. The semiconductor die 402 is attached to the second side at a center of the leadframe 102. The semiconductor die is attached to the leadframe using standard die attach processes. For example, in one embodiment, a die attach layer 404 secures the semiconductor die 402 to the second side of the center of the leadframe 102 through the protection layer 104. In some embodiments, the semiconductor die 402 covers all or most of the center of the leadframe 102 or the protection layer 104.

In one embodiment the semiconductor die 402 is electrically coupled to the leads 304 by connectors or wires 406. In some embodiments, first ends of the connectors 406 are coupled to respective pads on a top surface of the semiconductor die 402 opposite the die attach layer 404. In some embodiments, second ends of the connectors 406 are each coupled to one of the leads 304 on an opposite side as compared to the electrical contacts 203. In one embodiment, the connectors 406 are bond wires.

FIG. 5 is a top plan view of the leadframe 102 and the semiconductor die 402 of FIG. 4, with FIG. 4 taken at cross-section line AA of FIG. 5. As can be appreciated from FIG. 5, the semiconductor die 402 may have connectors 406 emerging from multiple sides and extending towards the leads 304 on multiple sides of the leadframe package 100. As also can be appreciated from FIG. 5, the openings 204 may extend well beyond the dimensions shown in FIG. 4 depending on the particular layout of the leadframe package 100. Although FIG. 5 depicts leadframe package 100 as being asymmetrical in first and second axes, other embodiments are symmetrical in one or more axes. Also, as is shown in FIG. 5, the leadframe package 100 may include one or more leads which are not coupled to the semiconductor die 402. These uncoupled leads may or may not have corresponding electrical contacts 202 on the opposing side of the side shown.

FIG. 6 is a cross-sectional view of the semiconductor die 402 and leadframe 102 of FIG. 4 with the second encapsulant 602 on the second side of the leadframe 102. After the semiconductor die 402 has been secured to the center of the leadframe 102 and has been electrically coupled to the leads 304, the second side of the leadframe is covered with the second encapsulant 602. The second encapsulant 602 may require preheating the encapsulant prior to application and then cooling as part of a curing process. The second encapsulant 602 fills the third recesses 302. In one embodiment, the second encapsulant 602 covers the entirety of the second side of the leadframe 102, the semiconductor die 402, the die attach layer 404, and the connectors 406. In some embodiments, the second encapsulant 602 is a resin molding, and in one embodiment the second encapsulant 602 is the same material as the first encapsulant 204.

In some embodiments, the second encapsulant 602 combines with the first encapsulant 204 through the first recesses 108 and third recesses 302. In one embodiment the second encapsulant 602 is combined with the first encapsulant 204 to form a unitary block of encapsulant. In other embodiments the first and second encapsulants 204 and 602 remain as distinct pieces that are secured together.

The first and second encapsulants 204 and 602 come together to completely fill openings in the leadframe 102 separating the leads from the center of the leadframe 102. In some embodiments, the openings in the leadframe 102 have a non-uniform gap distance (a non-uniform shape from the first side to the second side of the leadframe). A first sidewall of the opening and a second sidewall of the opening have two curved portions 207, 209 that meet in a point 211. The second sidewall being opposite the first sidewall. In some embodiments, the openings will have a cross-sectional shape similar to an hour glass as the first and third recesses 108 and 302 join together from opposing sides. In these embodiments, the gap distance is at the smallest at approximately a middle point of the sidewall, forming a discontinuity in the line of the sidewall in which the line of the sidewall is different on either side of the middle point.

In some embodiments, the thickness of the second encapsulant 602 is greater than the thickness of the first encapsulant 204. In one embodiment, the thickness of the second encapsulant 602 is approximately five times the thickness of the first encapsulant 204 (prior to the back-grinding that exposes the surface 305).

In some embodiments, the second encapsulant 602 is cured before proceeding to any remaining manufacturing steps. In other embodiments, the second encapsulant is not cured before proceeding with later manufacturing steps. The curing of the encapsulant 602 would normally not cause warpage due to the structural support to the leadframe 102 provided by the first encapsulant 204.

At this point in the manufacturing process, the center of the leadframe 102 has no structural supports contacting the leadframe 102 other than the first and second encapsulants 204 and 602. To achieve this configuration, it is not possible to apply encapsulant to the first and second sides of the leadframe 102 simultaneously that completely covers the center of the leadframe 102. An edge 213 of the lead 304 is exposed through the encapsulant 204, 602.

FIG. 7 is a cross-sectional view of the encapsulated leadframe package 100 of FIG. 6 after removal of some of the first encapsulant 204 on the first side of the leadframe 102 to expose the electrical contacts 202. A removal process is applied to the side of the first encapsulant 204 away from the leadframe 102 to remove a portion of the first encapsulant 204. In one embodiment, the removal process includes backgrinding the leadframe package 100. In other embodiments the removal process includes planarization. Once the removal is complete, a new planar surface 307 of the first encapsulant 204 is created that includes openings in the first encapsulant 204 that expose the surface 305 of the electrical contacts 202. The electrical contacts 202 are also partially removed such that they have contact surfaces 702 that are planar with the new planar surface of the first encapsulant 204. In this configuration, the electrical contacts 202 are an embedded ball grid array that becomes functionally similar to a land grid array. Each one of the electrical contacts 202 in the land grid array may provide electrical or thermal connections to the semiconductor die 402 from outside of the leadframe package 100. A second subset of the electrical contacts 202 are coupled to the center of the leadframe 102 and thus to the semiconductor die 402. The first subset of the electrical contacts 202 are connected to the semiconductor die 402 through the leads 304 and connectors 406. In one embodiment, sides of the leads 304 are also exposed through the first and second encapsulants 204 and 602.

FIG. 8 is a cross-sectional view of an alternate embodiment of a leadframe package in which leads do not extend to an edge 801 of an encapsulant 808. The leadframe package 800 shares many similarities to the leadframe package 100. For instance, the leadframe package 800 also includes a leadframe 802, a protection layer 804, electrical contacts 806, encapsulant 808, leads 810, a semiconductor die 812, a die attach layer 814, connectors 816, and contact surfaces 818. These components are similar to those described above with respect to leadframe package 100, except as discussed below.

As can be appreciated from FIG. 8, the leads 810 do not extend to the edge of the encapsulant 808. Instead, the ends of the leads 810 were etched so that only the electrical contacts 806 extend to any one of the surfaces of the encapsulant 808. The contact surfaces 818 of the electrical contacts 806 are coplanar to a surface of the encapsulant 808. In one embodiment, ends of the leads are etched by the same etching used to form openings that separate the leads 810 from the leadframe 802. In other embodiments the ends of the leads are etched by a different process or at a different time. In these embodiments, the encapsulant 808 completely surrounds all elements of the leadframe package 800 except the electrical contacts 806 at the contact surfaces 818.

FIG. 9 is a cross-sectional view of an alternate embodiment of a leadframe package in which two semiconductor die are attached to a leadframe in a stack. The leadframe package 900 shares many similarities to the leadframe package 100. For instance, the leadframe package 900 also includes a leadframe 902, a protection layer 904, electrical contacts 906, encapsulant 908, leads 910, a first semiconductor die 912, a die attach layer 914, first connectors 916, and contact surfaces 924. These components are similar to those described above with respect to leadframe package 100 except, as discussed below.

FIG. 9 highlights an embodiment that includes a second semiconductor die 918 stacked on the first semiconductor die 912. In one embodiment, the second semiconductor die 918 is smaller in length or width than the first semiconductor die 912. This allows access to the contacts on the top of the first semiconductor die 912. As is shown, first connectors 916 are similar to the connectors 406 shown in FIG. 4. In addition, the second semiconductor die 918 may be electrically coupled to the leads 910 using second connectors 920 or to the first semiconductor die 912 using third connectors 922. The connections at ends of the first, second, or third connectors 916, 920, and 922 may be shared with any other connectors, but the connections may also singularly electrically couple one of the first and second semiconductor dice 912 and 918 to each other or a lead without electrically coupling to another connector. The second and third connectors 920 and 922 may be made of the same material as the first connectors 916, such as bond wires for example.

In some embodiments, the dimensions of the leadframe package 900 are similar to that of the leadframe package 100. In one embodiments, the encapsulant 908 may have a greater ratio than the semiconductor package 100 of encapsulant thickness above a first side of the leadframe 902 adjacent to the protection layer 904 compared to encapsulant thickness above a second side of the leadframe 902, the second side opposite the first side.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   a semiconductor die;
   a leadframe having a first side and a second side opposite the first side, the leadframe having a plurality of recesses in the first side, the semiconductor die coupled to the second side of the leadframe;
   a plurality of discrete electrical contacts in a first group of the plurality of recesses, the plurality of discrete electrical contacts having a first portion extending into a respective one of the first group of the plurality of recesses and a second portion extending away from the respective one of the first group of the plurality of recesses; and
   an encapsulant covering the first side of the leadframe and the second side of the leadframe, a surface of each of the plurality of discrete electrical contacts being exposed from the encapsulant and substantially coplanar with the encapsulant.

2. The device of claim 1, wherein the plurality of discrete electrical contacts each have a surface that is coplanar with a surface of a first side of the encapsulant.

3. The device of claim 2, wherein the encapsulant has a second side opposite the first side, the first and second sides of the encapsulant being in a parallel plane to the first side of the leadframe.

4. The device of claim 3, wherein a thickness of the encapsulant between the second side of the encapsulant and the second side of the leadframe is no more than five times the thickness of the encapsulant between the first side of the encapsulant and the first side of the leadframe.

5. The device of claim 1, wherein a second group of the plurality of recesses have a decreasing cross sectional area from a surface of the first side of the leadframe into the leadframe.

6. The device of claim 5, wherein each one of the second group of the plurality of recesses is a hemispherical indentation.

7. The device of claim 1, wherein the discrete electrical contacts are solder balls.

8. The device of claim 1, wherein the leadframe has a plurality of openings, each one of the plurality of openings including a respective one of the plurality of recesses in the second side of the leadframe and a respective ones of a second group of the plurality of recesses in the first side of the leadframe, the encapsulant being in the plurality of openings in the leadframe.

9. The device of claim 8, further comprising a bondwire coupled at a first end to the die and coupled at a second end to a lead of the leadframe, the lead separated from the leadframe by one of the plurality of openings.

10. A device, comprising: a leadframe having a first side and a second side opposite the first side, the leadframe including: a plurality of openings extending from the first side to the second side, each one of the plurality of openings including a first curved indentation from the first side and a second curved indentation from the second side; a plurality of leads separated from a center section of the leadframe by the plurality of openings; of indentations; and a resin molding around the leadframe and the plurality of contacts, wherein a first surface of the plurality of contacts being exposed through the resin molding and substantially coplanar with the resin molding.

11. The device of claim 10, wherein at an intersection of the first indentation and the second indentation form a point.

12. A device, comprising: a leadframe having a first side and a second side opposite the first side, the leadframe including: a center section having a first curved recess in the first side; and a first lead separated from the center section by a second curved recess in the first side and a third curved recess in the second side, the second curved recess communicating to the third curved recess; a discrete electrical contact in the first curved recess; a semiconductor die on the second side of the center section of the leadframe; an encapsulant surrounding the semiconductor die and in the second and third curved recesses; and a surface of said discrete electrical contact being exposed from the encapsulant and substantially coplanar with the encapsulant.

13. The device of claim 12 wherein the discrete electrical contact is a spherical dome.

14. The device of claim 12 wherein the dimensions of the first recess are equal to the dimensions of the second recess.

15. The device of claim 12 wherein the dimensions of the second recess are equal to the dimensions of the third recess.

16. The device of claim 12 wherein the second recess is in fluid communication with the third recess.

17. The device of claim 12, further comprising:
   a bond wire having a first end coupled to the semiconductor die and a second end coupled to the first lead.

18. The device of claim 12, further comprising:
   a second lead of the leadframe separated from the center section by a fourth recess in the first side and a fifth recess in the second side, the fourth recess opposite the fifth recess in the leadframe, the encapsulant in the fourth and fifth recesses.

19. The device of claim 12, wherein the first, second, and third recesses have a decreasing cross sectional area from a surface of the first side of the leadframe into the leadframe.

* * * * *

UNITED STATES PATENT AND TRADEMARK OFFICE
CERTIFICATE OF CORRECTION

PATENT NO. : 10,147,673 B2  
APPLICATION NO. : 15/281800  
DATED : December 4, 2018  
INVENTOR(S) : Jefferson Talledo Page 1 of 1

It is certified that error appears in the above-identified patent and that said Letters Patent is hereby corrected as shown below:

In the Claims

<u>Column 10, Line 12, Claim 10:</u>
"the plurality of openings; of indentations; and a resin" should read, -- the plurality of openings; a plurality of indentations in the first side of the leadframe; a plurality of contacts in the plurality of indentations; and a resin --.

Signed and Sealed this
Twentieth Day of October, 2020

Andrei Iancu
*Director of the United States Patent and Trademark Office*